(12) United States Patent
Shen

(10) Patent No.: US 9,023,727 B2
(45) Date of Patent: May 5, 2015

(54) METHOD OF MANUFACTURING SEMICONDUCTOR PACKAGING

(75) Inventor: Geng Shin Shen, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 238 days.

(21) Appl. No.: 13/534,289

(22) Filed: Jun. 27, 2012

(65) Prior Publication Data

US 2014/0004697 A1 Jan. 2, 2014

(51) Int. Cl.
*H01L 21/44* (2006.01)
*H01L 21/48* (2006.01)
*H01L 23/00* (2006.01)

(52) U.S. Cl.
CPC ... *H01L 21/4853* (2013.01); *H01L 2224/05027* (2013.01); *H01L 2224/11332* (2013.01); *H01L 24/11* (2013.01); *H01L 24/13* (2013.01); *H01L 2224/05166* (2013.01); *H01L 2224/05582* (2013.01); *H01L 2224/05644* (2013.01); *H01L 2224/05647* (2013.01); *H01L 2224/05655* (2013.01); *H01L 2224/11318* (2013.01); *H01L 2224/1132* (2013.01); *H01L 2224/11334* (2013.01); *H01L 2224/1145* (2013.01); *H01L 2224/11452* (2013.01); *H01L 2224/11462* (2013.01); *H01L 2224/1147* (2013.01); *H01L 2224/11849* (2013.01); *H01L 2224/13082* (2013.01); *H01L 2224/13144* (2013.01); *H01L 2224/13147* (2013.01); *H01L 2224/13155* (2013.01); *H01L 2224/03912* (2013.01); *H01L 2224/05572* (2013.01)

(58) Field of Classification Search
USPC .......................................... 438/612, 613, 614
See application file for complete search history.

(56) References Cited

U.S. PATENT DOCUMENTS 7,208,834 B2 *   4/2007  Lee et al. ....................... 257/737
2009/0174069 A1 * 7/2009  Nguyen et al. ................ 257/737

* cited by examiner

*Primary Examiner* — Thien F Tran
(74) *Attorney, Agent, or Firm* — WPAT, P.C.; Anthony King; Kay Yang

(57) ABSTRACT

The present disclosure is related to a method of providing a die structure for semiconductor packaging. The method includes providing a substrate with a bonding pad; forming a patterned mask layer on the substrate; forming an opening on the mask layer; depositing a conductive layer in the opening; forming a cap layer on the conductive layer, and removing the mask layer. The cap layer forming step allows the contacting area between the cap layer and the conductive layer to be substantially equal to the top surface area of the conductive layer by reflowing solder material prior to the removal of the mask layer.

15 Claims, 10 Drawing Sheets

METHOD OF MANUFACTURING SEMICONDUCTOR PACKAGING

BACKGROUND OF THE INVENTION

1. Technical Field

The present invention relates to a semiconductor packaging, and more particularly, to a method of manufacturing a semiconductor die having a solder capping without an electrodeposition process.

2. Background

With the recent rapid miniaturization of electronic devices, there is expanding demand for flip-chip technology to satisfy high density interconnections in electronic devices. One popular step in the flip-chip interconnection process involves the deposition of solder alloys onto the bond pads of chips. Among popular bumping technologies, electroplating is one of the more commonly used in industry today. However, there are several problems encountered by the electroplating process at the current technology. General electroplating processes cost more than screen printing or ball dropping processes. In addition, the prohibition of the usage of lead in solder fundamentally alters the composition of the solder. When there are large differences between electrochemical reduction potentials of various constitutions of solder, the electroplating of tin and other metals such as copper is difficult.

Moreover, the control of electrolyte stability is also a universal problem for the electrodeposition of tin and its alloys as in aqueous solutions. The aforementioned factors mean electroplating requires greater operational sophistication and cost.

The current disclosure provides a method of forming a solder capping without using electrodepositing processes. With the introduction of a photoresist layer during the printing or ball dropping process, the current method provides better control of solder paste volume at a lower expenditure than that of an average electrodeposition process.

SUMMARY

One embodiment of the present invention describes a method of providing a semiconductor structure, wherein the method includes the steps of providing a substrate with at least a bonding pad on the substrate; forming a patterned mask layer on the substrate, wherein the patterned mask layer includes an opening which exposes at least a part of the bonding pad; depositing a conductive layer in the opening, wherein a height difference exists between the top surface of the conductive layer and the top surface of the adjacent mask layer, and the top surface of the conductive layer is lower than the top surface of the adjacent mask layer; forming a cap layer on the conductive layer; and removing the patterned mask layer; wherein the cap layer forming step allows the contact area between the cap layer and the conductive layer to be substantial equal to the top surface area of the conductive layer.

In one embodiment, the step of forming the cap layer in the aforesaid method includes a disposing process which can be ball dropping, random spraying, printing, solder paste spreading, or the combination thereof.

In another embodiment, the step of forming the cap layer in the aforesaid method includes a solder reflowing process.

In another embodiment, the step of removing the patterned mask layer can be achieved concomitantly with the reflowing step under an elevated temperature treatment.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
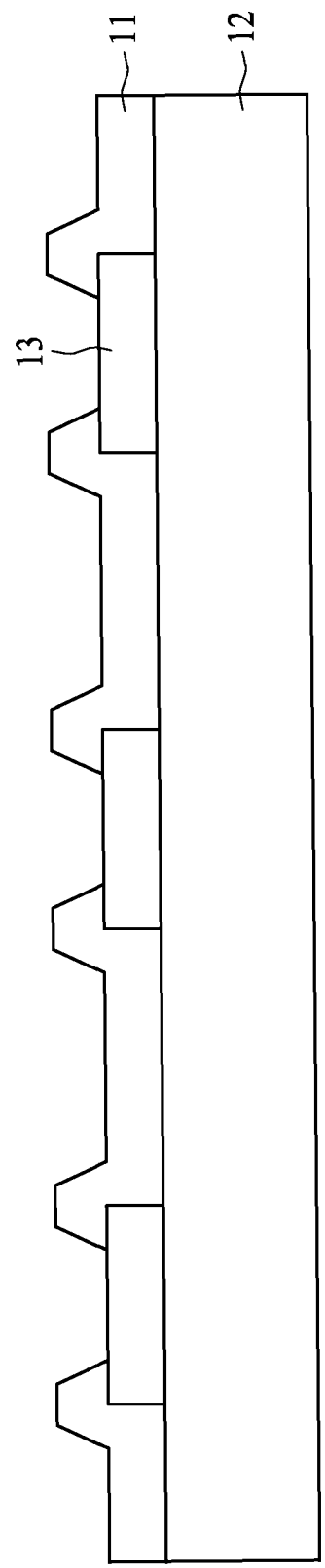
FIGS. 1 to 4 illustrate schematic sectional views of a process for manufacturing a semiconductor die.

According to one embodiment, a method of providing a semiconductor structure, for example, a packaging structure, is disclosed. As shown in FIG. 1, a plurality of bonding pads 13 are photolithographically deposited on the top surface of a substrate 12. In the present embodiment, the deposition process can be, but is not limited to, a chemical vapor deposition process, a plasma-enhanced chemical vapor deposition process, a physical vapor deposition process such as sputtering or evaporation, or the like. The substrate 12 can be a semiconductor substrate or a printed circuit board. A dielectric layer 11 configured to be a passivation layer is subsequently formed on top of the bonding pads 13. The dielectric layer 11 can be, but is not limited to, an oxide layer, a nitride layer, or a polymeric layer. A plurality of openings are formed on the dielectric layer 11. The openings are positioned in order to be coupled with the bonding pads 13 and expose a portion of the pads 13.

Figure 2:
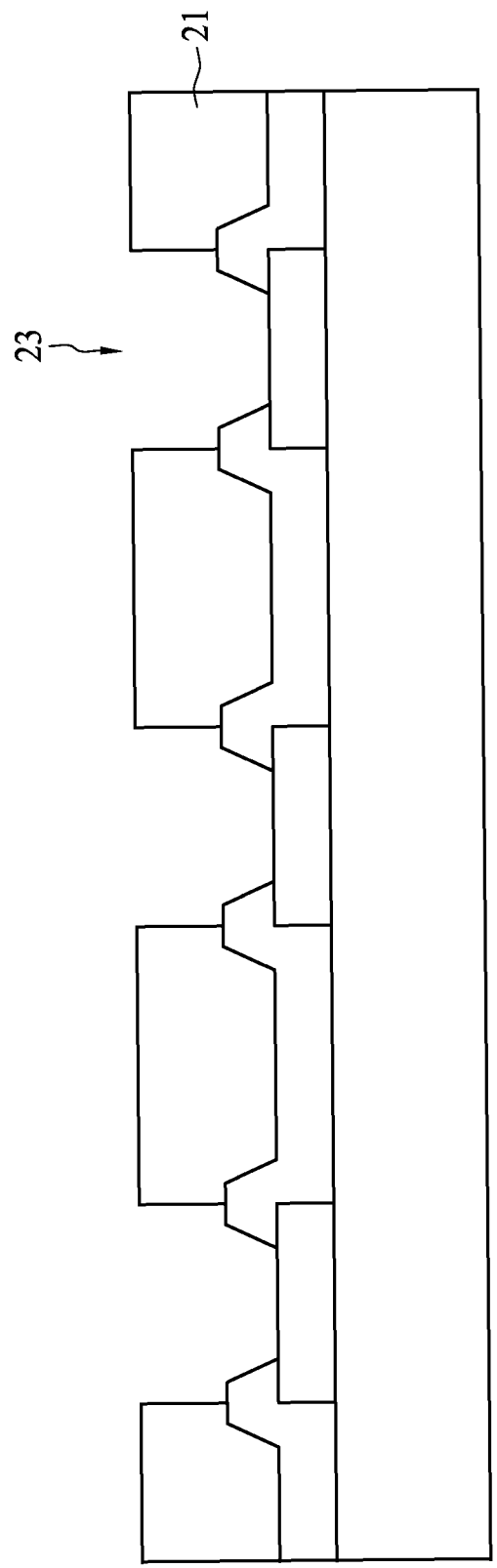

In FIG. 2, a patterned mask layer 21 is formed on the portion of the dielectric layer 11 where there is no opening. The patterned mask layer 21 can be, but is not limited to, a photoresist layer or a dielectric layer. A plurality of openings 23 are formed on the patterned mask layer 21 in predetermined positions such that the top surfaces of the bonding pads 13 are exposed to the external environment.

Figure 3:
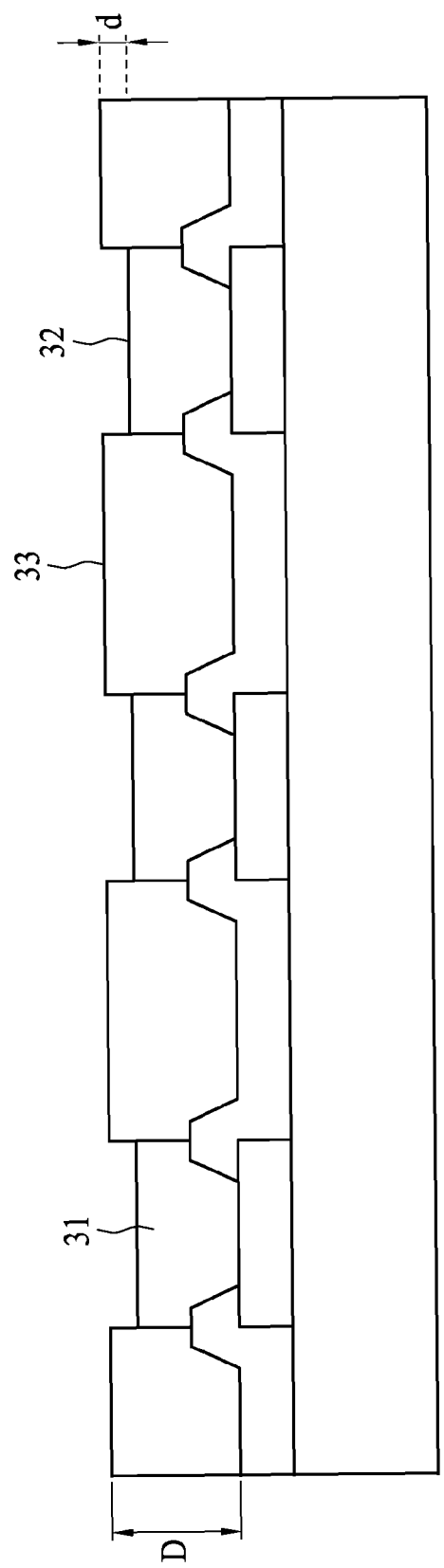

As shown in FIGS. 2 and 3, a conductive layer 31 is deposited in the opening 23 in a manner which allows the top surface 32 of the conductive layer 31 to be lower than the top surface 33 of the adjacent mask layer 21. A height difference "d" exists between the top surface 32 of the conductive layer 32 and the top surface 33 of the adjacent mask layer 21. In one embodiment, the height difference "d" is determined to be in a range of from half to one-fourth of the height "D" of the mask layer 21. The conductive layer 31 can be deposited in any of several manners such as via chemical vapor deposition process, plasma-enhanced chemical vapor deposition process, and physical vapor deposition process such as sputtering or evaporation. The material for the conductive layer 32 includes any conductive metal, typically copper, gold, nickel, or the alloy thereof.

Figure 4:
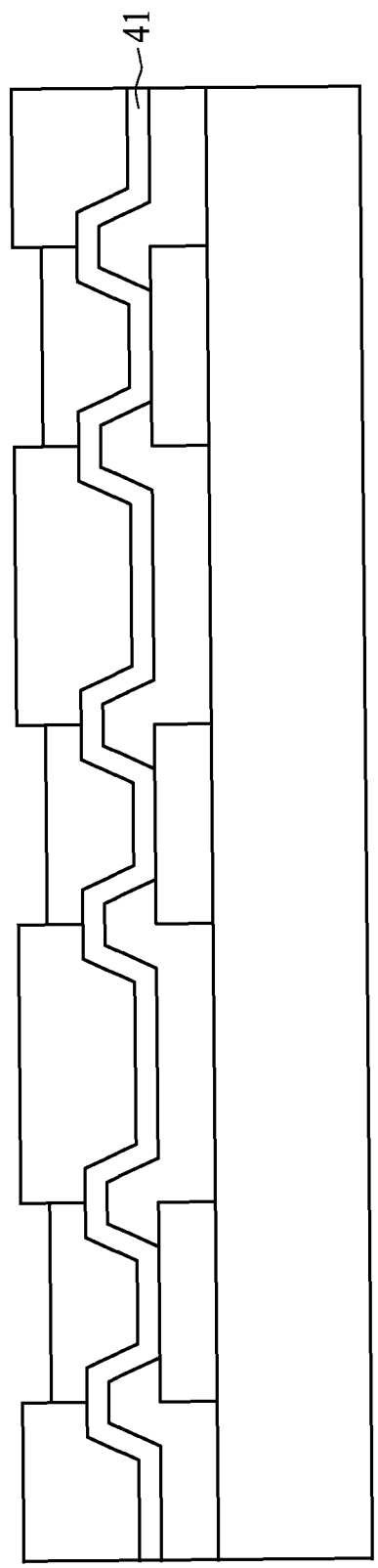

Referring to FIG. 4, according to another embodiment, an under bump metallization 41 (UBM) layer is formed on top of the dielectric layer 11 and the exposed portion of the bonding pad 13. The UBM layer includes at least two sublayers, namely, an adhesive layer and a seed layer. The adhesive layer is in direct contact with the bonding pad 13 and is typically made of titanium or titanium tungsten (TiW) in order to provide a mechanically sound connection and a better adhesion between the bonding pad 13 and the conductive layer 31. The seed layer is positioned on the adhesive layer and is conventionally composed of gold, copper, nickel or the alloy. The purpose of the seed layer is to serve as a cathode during electroplating process. The UBM 41 layer shown in FIG. 4 is formed by a metal sputtering process, a vapor deposition process, or a metal paste printing process. However, other manners which may be conceived by people having ordinary skill in the art can also be used in the present UBM formation step.

Figure 5:
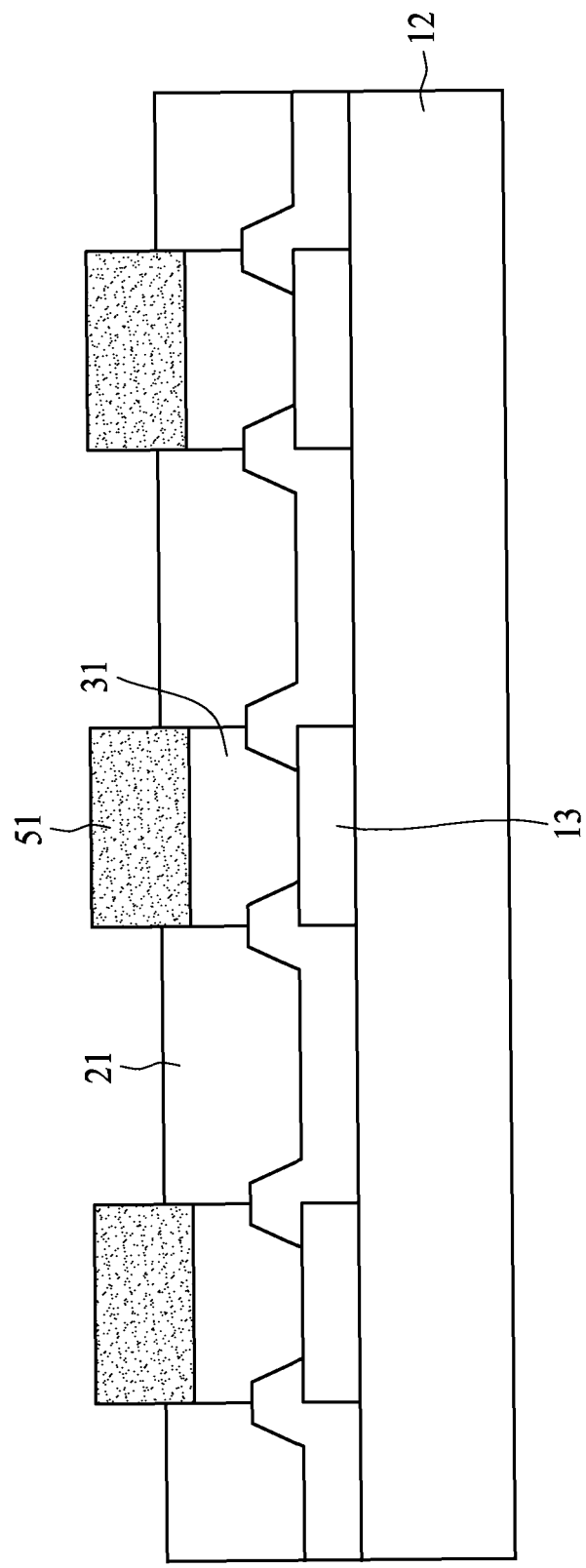
FIG. 5 depicts a schematic sectional view of an intermediate product after a solder paste printing process.

As shown in FIG. 5, a solder paste layer 51 is formed on top of the conductive layer 31 by a printing process. The printing process can be followed by a reflow process to complete the formation of the cap layer. In the present embodiment, the solder paste is prepared to undergo a screen printing or a stencil printing process so as to form patterned solder paste on the underlying conductive layer 31. The dimension of patterned solder paste does not have to be the same as that of the conductive layer. In other word, the width of the solder paste can be controlled by the emulsion pattern on the screen or the opening on the stencil, while the thickness "t" of the solder paste can be determined by the position relative to the structure where the screen or stencil is disposed.

Figure 6:
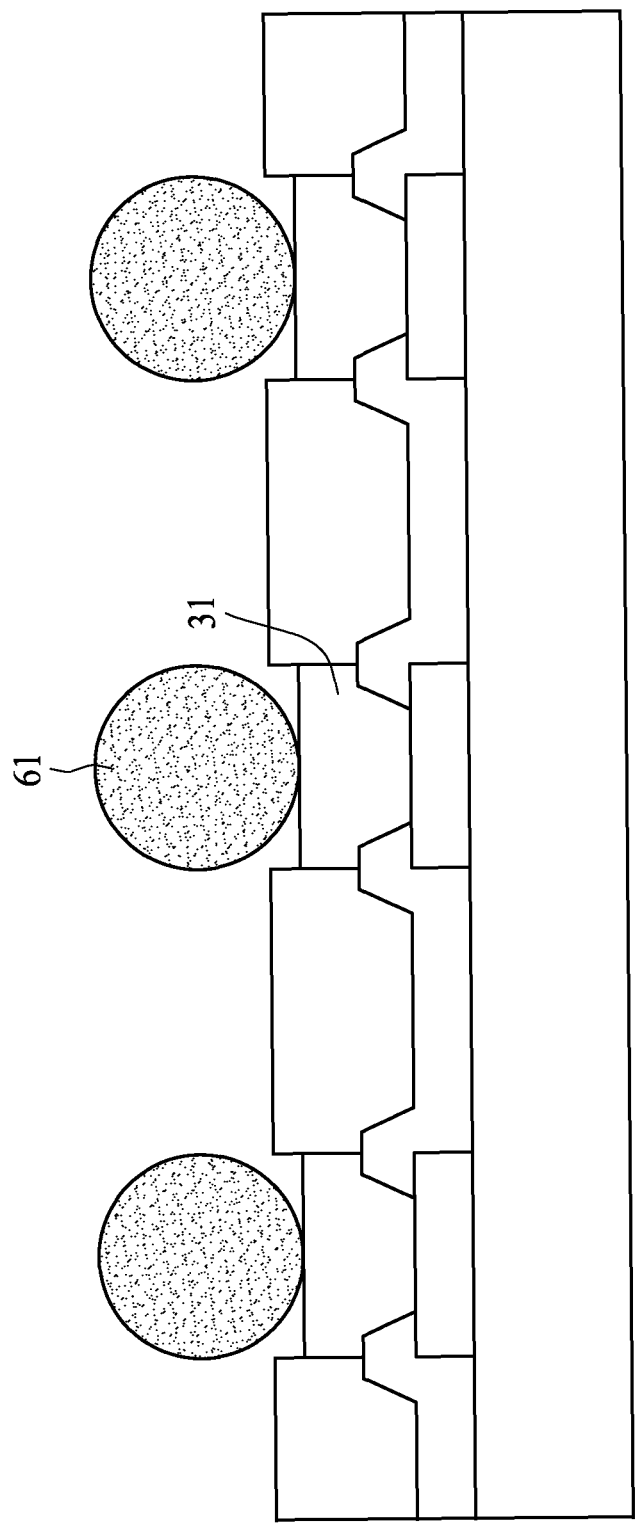
FIG. 6 depicts a schematic sectional view of an intermediate product after a ball dropping process.
Figure 7:
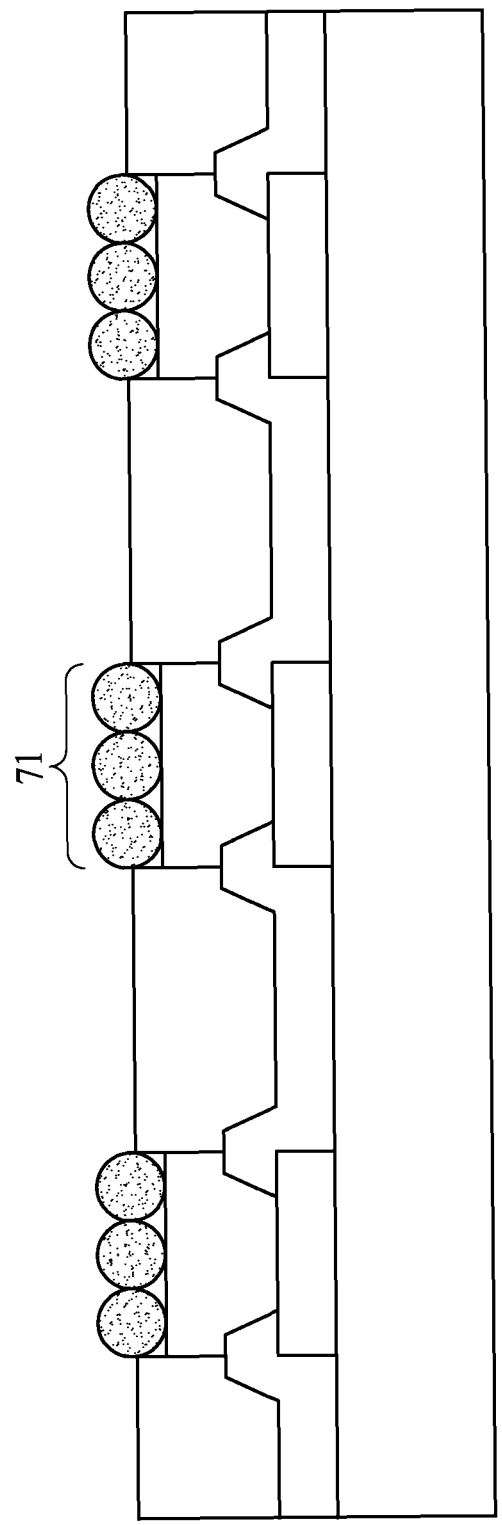
FIG. 7 depicts a schematic sectional view of an intermediate product after a random spraying process.

As shown in FIG. 6, a solder ball 61 is disposed on top of the conductive layer 31 by a ball dropping process. The ball dropping process can be subsequently followed by a reflow process to complete the formation of the cap layer. Conventionally, a plurality of solder balls are disposed on a stencil plate with numerous openings, wherein the distribution of the openings corresponds to the pattern of the underlying conductive layer. The dimension of the opening on the stencil plate can be modulated to permit either one or multiple solder balls to pass. In addition, selection of the solder ball size introduces an additional degree of freedom to the process. In the present embodiment, at least one solder ball can be disposed on the surface of the structure. Because the surface morphology now includes a plurality of concave valleys and convex plateaus, the solder balls of various sizes can be self-assembled at the concave valleys with the assistance of the stencil plate. As shown in FIG. 6, a ball dropping process is conducted to form one solder ball at each concave valley, while in FIG. 7, a random spraying process allows a plurality of solder balls 71 to be trapped in the concave valley. The final thickness of the solder capping layer is determined by the amount of solder material disposed at the present step. A reasonable calculation can be conducted to select the size of the solder ball and the disposing means described above.

Figure 8:
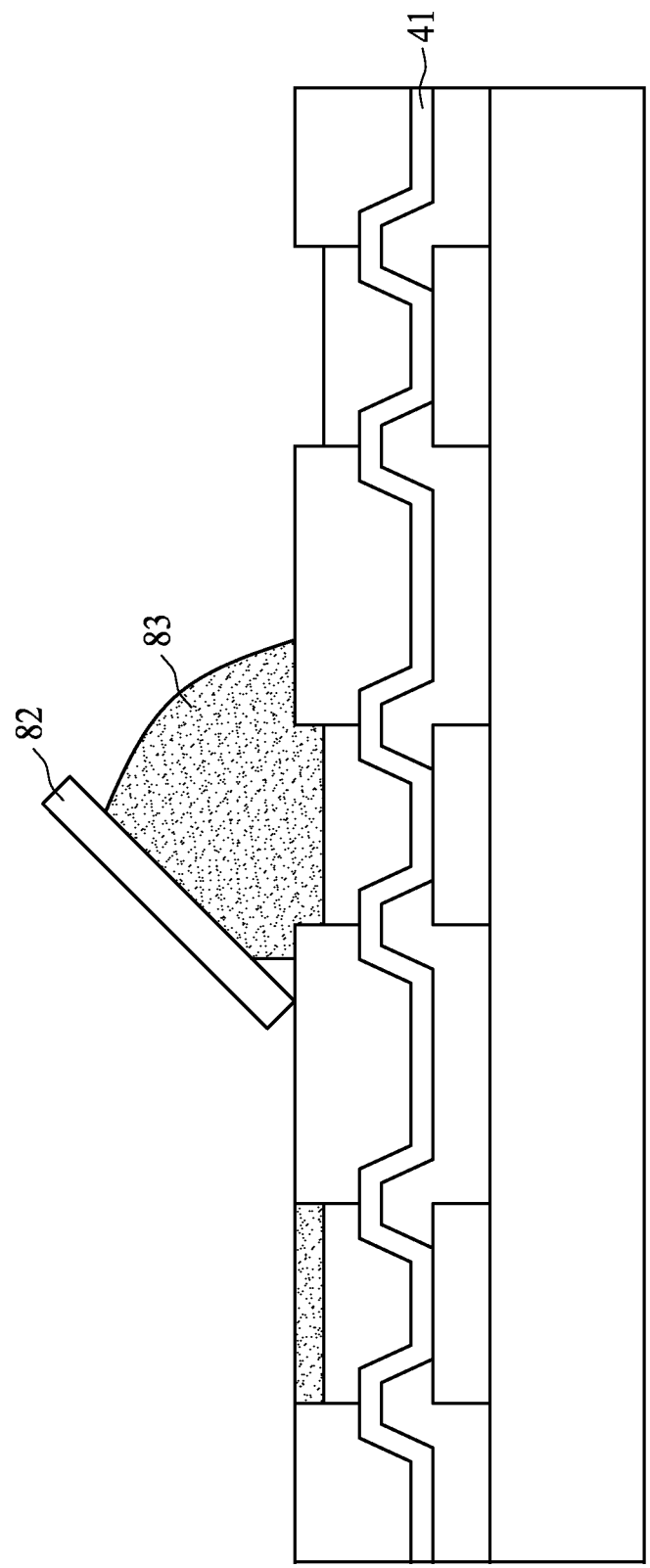
FIG. 8 depicts a schematic sectional view of an intermediate product during a solder paste spreading process.

As shown in FIG. 8, an alternative approach to forming the capping layer involves solder paste spreading. The spreading process can be followed by a reflow process to complete the formation of the cap layer. In one embodiment, solder paste 83 is composed of an adhesive matrix with a plurality of solder beads blended in the matrix. A scraper 82 is utilized to spread the solder paste on the surface of the conductive layer and the mask layer. Due to the existence of concave structures on the surface, a predetermined amount of solder paste remains in the concave structure while the excess solder paste is carried away by the scraper 82. The amount of solder paste retained in the concave structure is determined by the dimension of the concave structure; therefore, the height difference d (as shown in FIG. 3) between the conductive layer and the mask layer is directly related to the size of the final product, that is, the reflowed solder. In the present embodiment, the height difference "d" can be, but is not limited to, in a range of from one-third to one-fourth of the height "D" of the mask layer.

Figure 9:
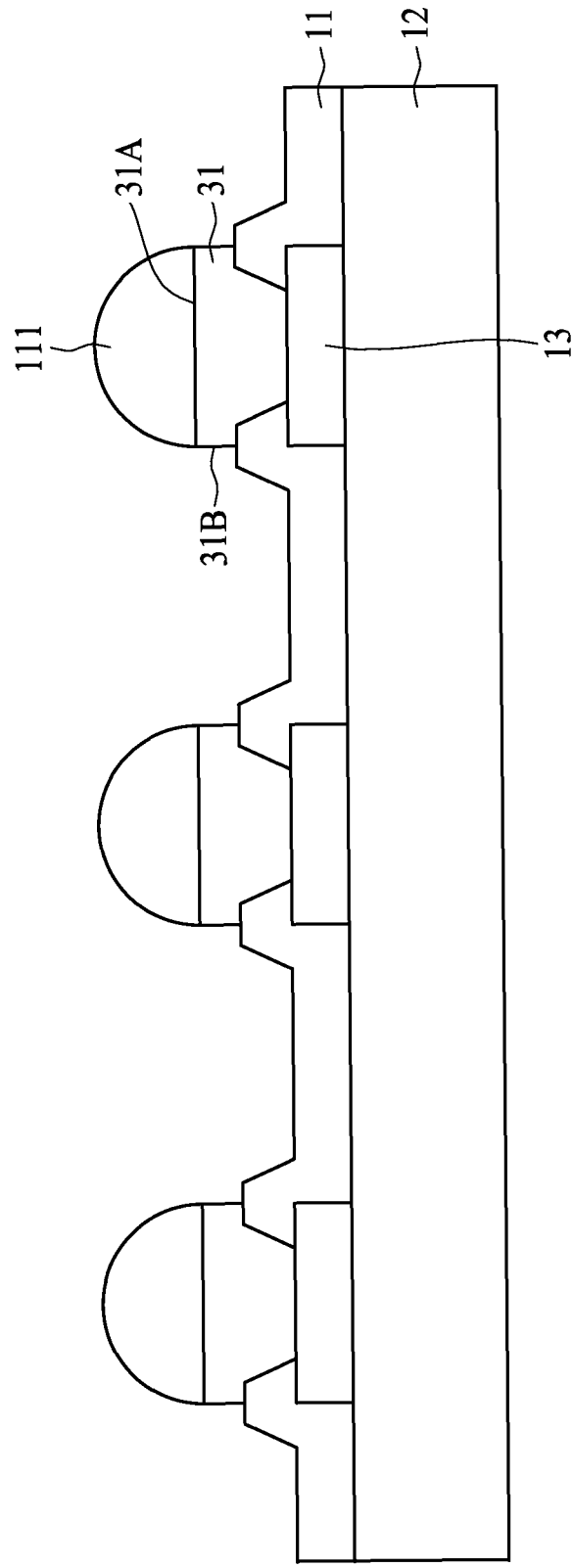
FIGS. 9 and 10 depict a schematic sectional view of a product after the solder reflowing process and the removal of the patterned mask layer.

After applying the solder materials on the conductive layer, a reflow process is carried out. Next, the mask layer is removed by a photoresist stripping process or an etching process, depending on the materials of the mask layer. In one embodiment, the solder reflow process and the mask removing process are accomplished concomitantly under one elevated temperature treatment. As shown in FIG. 9, a hemispherical cap layer 111 is formed on top of the conductive layer 31. However, the cap layer 111 is not limited to be in a shape of hemisphere. Based on the actual amount of the solder material and the wettability of the solder with respect to the underlying conductive layer, the final morphology of the cap layer is generally a convex structure. According to the procedure stated above, after removal of the mask layer, the solder material is only in contact with the top surface 31A of the conductive layer 31, and the side wall 31B of the conductive layer 31 is substantially free from any solder material.

Figure 10:
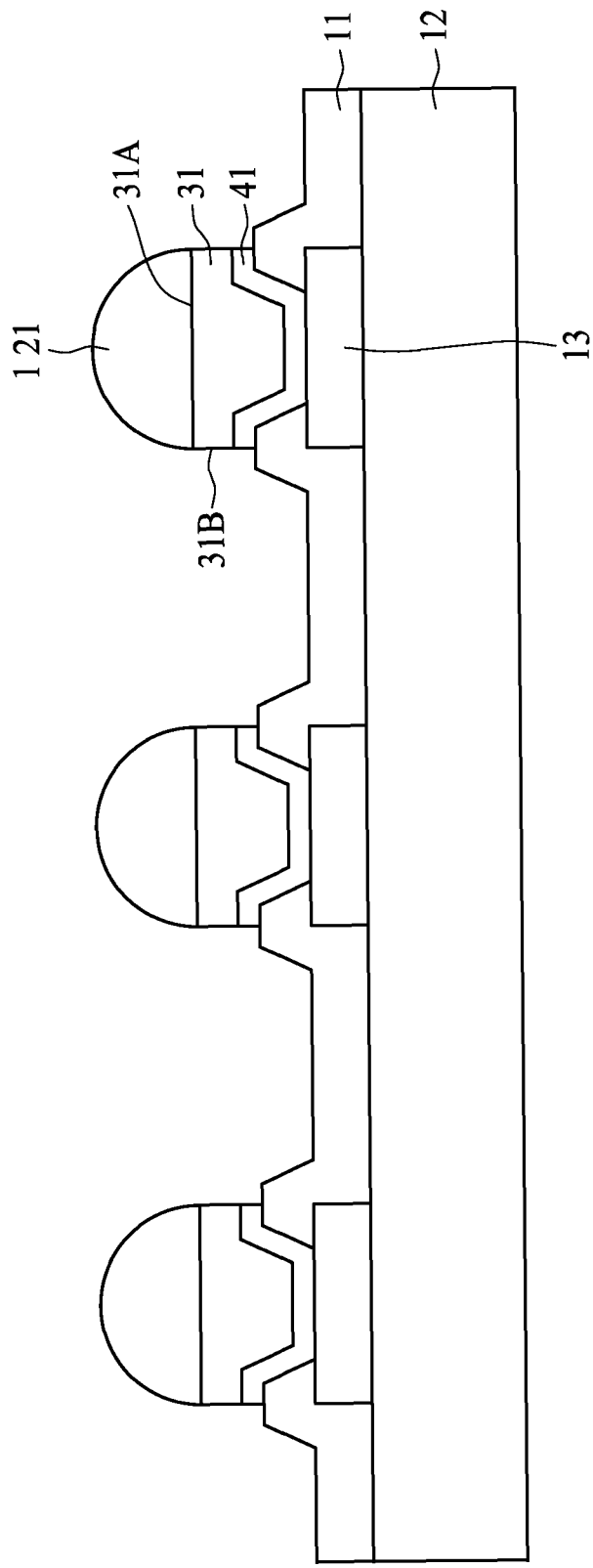

As shown in FIG. 10, in one embodiment, a UBM layer 41 is positioned under the conductive layer 31. The UBM layer 41 is exposed after the removal of the mask layer. Therefore, an additional procedure is applied to remove the portion of the UBM layer not overlapping with the conductive layer 31.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of providing a semiconductor structure, the method comprising the steps of:
   providing a substrate with at least a bonding pad on the substrate;
   forming a patterned mask layer on the substrate, wherein the patterned mask layer includes an opening which exposes at least a part of the bonding pad;

depositing a conductive layer in the opening, wherein a height difference exists between a top surface of the conductive layer and a top surface of the adjacent mask layer, and the top surface of the conductive layer is lower than the top surface of the adjacent mask layer; and wherein a ratio of the height difference and a thickness of the mask layer is controlled to be in a range of from ¼ to ½;

forming a cap layer on the conductive layer, wherein the cap layer is a solder layer, wherein forming the cap layer comprises a reflowing step; and removing the patterned mask layer;

wherein the cap layer forming step allows a contacting area between the cap layer and the conductive layer to be substantially equal to the top surface area of the conductive layer;

wherein forming the cap layer comprises a disposing step which is random spraying, and the reflowing step is subsequent to the disposing step;

wherein the random spraying comprises positioning a plurality of solder balls on the conductive layer.

2. The method as in claim 1, further comprising a step of forming an under bump metallization (UBM) layer.

3. The method as in claim 2, wherein the UBM layer is formed by sputtering, vapor deposition, or printing.

4. The method as in claim 2, further comprising a step of removing the UBM layer.

5. The method as in claim 1, wherein the height difference is in a range of from ¼ to ⅓ of the thickness of the mask layer.

6. The method as in claim 1, wherein the conductive layer is formed by materials selected from the group of nickel, copper, gold, and the combination thereof.

7. A method of providing a semiconductor structure, the method comprising the steps of:

providing a substrate with at least a bonding pad on the substrate;

forming a patterned mask layer on the substrate, wherein the patterned mask layer includes an opening which exposes at least a part of the bonding pad;

depositing a conductive layer in the opening, wherein a height difference exists between a top surface of the conductive layer and a top surface of the adjacent mask layer, and the top surface of the conductive layer is lower than the top surface of the adjacent mask layer;

forming a cap layer on the conductive layer, wherein the cap layer is a solder layer, wherein forming the cap layer comprises a reflowing step; and removing the patterned mask layer;

wherein the cap layer forming step allows a contacting area between the cap layer and the conductive layer to be substantially equal to the top surface area of the conductive layer;

wherein forming the cap layer comprises a disposing step which can be ball dropping, random spraying, solder paste spreading, or the combination thereof;

wherein the removing step can be achieved concomitantly with the reflowing step under an elevated temperature treatment.

8. The method as in claim 7, further comprising a step of forming an under bump metallization (UBM) layer.

9. The method as in claim 8, wherein the UBM layer is formed by sputtering, vapor deposition, or printing.

10. The method as in claim 8, further comprising a step of removing the UBM layer.

11. The method as in claim 7, wherein the height difference is in a range of from about ¼ to about ⅓ of the thickness of the mask layer.

12. The method as in claim 7, wherein the conductive layer is formed by materials selected from the group of nickel, copper, gold, and the combination thereof.

13. The method as in claim 7, wherein the reflowing step is subsequent to the disposing step.

14. A method of providing a semiconductor structure, the method comprising the steps of:

providing a substrate with at least a bonding pad on the substrate;

forming a patterned mask layer on the substrate, wherein the patterned mask layer includes an opening which exposes at least a part of the bonding pad;

depositing a conductive layer in the opening, wherein a height difference exists between a top surface of the conductive layer and a top surface of the adjacent mask layer, and the top surface of the conductive layer is lower than the top surface of the adjacent mask layer;

forming a cap layer on the conductive layer; and removing the patterned mask layer;

wherein the cap layer forming step allows a contacting area between the cap layer and the conductive layer to be substantially equal to the top surface area of the conductive layer;

wherein forming the cap layer comprises a disposing step which is random spraying, and a reflowing step is subsequent to the disposing step;

wherein the random spraying comprises positioning a plurality of solder balls on the conductive layer.

15. A method of providing a semiconductor structure, the method comprising the steps of:

providing a substrate with at least a bonding pad on the substrate;

forming a patterned mask layer on the substrate, wherein the patterned mask layer includes an opening which exposes at least a part of the bonding pad;

depositing a conductive layer in the opening, wherein a height difference exists between a top surface of the conductive layer and a top surface of the adjacent mask layer, and the top surface of the conductive layer is lower than the top surface of the adjacent mask layer;

forming a cap layer on the conductive layer; and removing the patterned mask layer;

wherein the cap layer forming step allows a contacting area between the cap layer and the conductive layer to be substantially equal to the top surface area of the conductive layer;

wherein forming the cap layer comprises a reflowing step;

wherein the removing step can be achieved concomitantly with the reflowing step under an elevated temperature treatment.

* * * * *